United States Patent
Chou et al.

(10) Patent No.: US 10,622,332 B1
(45) Date of Patent: Apr. 14, 2020

(54) SUBSTRATE SEPARATION SYSTEM AND METHOD

(71) Applicant: PRINCO CORP., Hsinchu (TW)

(72) Inventors: Chun-Hsiung Chou, Hsinchu (TW); Chin-Huang Huang, Hsinchu (TW); Chih-Kuang Yang, Hsinchu (TW)

(73) Assignee: PRINCO CORP., Hsinchu (TW)

( * ) Notice: Subject to any disclaimer, the term of this patent is extended or adjusted under 35 U.S.C. 154(b) by 0 days.

(21) Appl. No.: 16/511,407

(22) Filed: Jul. 15, 2019

(30) Foreign Application Priority Data

Oct. 1, 2018 (TW) .............................. 107134709 A

(51) Int. Cl.
| | |
|---|---|
| B32B 43/00 | (2006.01) |
| H01L 21/687 | (2006.01) |
| H01L 23/00 | (2006.01) |
| H01L 21/683 | (2006.01) |

(52) U.S. Cl.
CPC ............ *H01L 24/98* (2013.01); *B32B 43/006* (2013.01); *H01L 21/6835* (2013.01); *H01L 21/6838* (2013.01); *H01L 24/799* (2013.01); H01L 2221/68381 (2013.01); H01L 2221/68386 (2013.01); Y10S 156/93 (2013.01); Y10S 156/941 (2013.01); *Y10T 156/1132* (2015.01); *Y10T 156/1137* (2015.01); *Y10T 156/1184* (2015.01); *Y10T 156/1939* (2015.01); *Y10T 156/1944* (2015.01); *Y10T 156/1967* (2015.01); *Y10T 156/1978* (2015.01)

(58) Field of Classification Search
CPC ......... Y10T 156/1132; Y10T 156/1137; Y10T 156/1168; Y10T 156/1184; Y10T 156/1939; Y10T 156/1944; Y10T 156/1967; Y10T 156/1978; Y10S 156/93; Y10S 156/941; H01L 2221/68381; H01L 2221/68386

See application file for complete search history.

(56) References Cited

U.S. PATENT DOCUMENTS

| | | | | |
|---|---|---|---|---|
| 6,569,259 | B1 * | 5/2003 | Kagawa ................. | B29B 17/02 134/37 |
| 8,470,129 | B1 * | 6/2013 | Wang ..................... | B32B 38/10 156/705 |
| 9,162,435 | B2 * | 10/2015 | Honda ................... | B32B 38/10 |
| 9,576,854 | B2 * | 2/2017 | Itou ........................ | H01L 21/78 |

(Continued)

FOREIGN PATENT DOCUMENTS

| | | |
|---|---|---|
| TW | 201024828 A1 | 7/2010 |
| TW | 201423832 A | 6/2014 |

*Primary Examiner* — Mark A Osele
(74) *Attorney, Agent, or Firm* — Muncy, Geissler, Olds & Lowe, P.C.

(57) ABSTRACT

A substrate separation system configured to remove a substrate from a carrier is provided. The substrate separation system includes a stage, an upper fixing portion, a suction portion, a cutting portion and a blowing portion. The stage is configured to carry the carrier. The upper fixing portion is disposed above the stage so as to be movable up and down. The suction portion is disposed above the stage so as to be movable up and down, and has a hollow portion to accommodate the upper fixing portion. The cutting portion is disposed on one side of the stage. The blowing portion is disposed on another side of the stage, and is configured to provide a blowing force to a position between the substrate and the carrier.

10 Claims, 4 Drawing Sheets

(56) References Cited

U.S. PATENT DOCUMENTS

| | | | |
|---|---|---|---|
| 9,643,396 B2* | 5/2017 | Honda | B32B 43/006 |
| 9,962,919 B2* | 5/2018 | Tang | B32B 43/006 |
| 2015/0217557 A1* | 8/2015 | Lee | B32B 43/006 |
| | | | 156/707 |

* cited by examiner

SUBSTRATE SEPARATION SYSTEM AND METHOD

CROSS REFERENCE TO RELATED APPLICATION

This application claims priority to Taiwanese Application No. 107134709, filed on Oct. 1, 2018. The entire disclosure of the above application is incorporated herein by reference.

BACKGROUND

1. Field of the Invention

The present disclosure relates to the field of substrate, more particularly, to a substrate separation system and a method.

2. Description of the Related Art

A substrate can be used for manufacturing a package substrate, a printed circuit board, a flexible package substrate, and a flexible circuit board, etc. Integration into high-density systems is an inevitable trend in the miniaturization of today's electronic products, especially the utilization of flexible substrates to fabricate flexible package structures. They can be more effectively applied to various products to satisfy with the needs of miniaturization.

When the substrate is manufactured, the substrate is first fixed to a carrier, then circuits are formed on the substrate, and a polyimide (PI) thin film is coated on the surface of the substrate. The PI thin film is used as a protective layer. After that, the substrate needs to be removed from the carrier, and a via process and subsequent processes are performed on the substrate.

In the related art, the substrate is removed from the carrier manually or by using a laser method. Manually removing the substrate from the carrier is inefficient. When a laser method is used to remove the substrate from the carrier, the machine cost is high.

Therefore, there is a need to provide a substrate separation system and a method so as to resolve the problems that occur when the substrate is removed from the carrier in the related art.

SUMMARY

One objective of the present disclosure is to provide a substrate separation system and a method, which can resolve the problems that occur when the substrate is removed from the carrier in the related art.

The present disclosure provides a substrate separation system configured to remove a substrate from a carrier. The substrate separation system comprises a stage, an upper fixing portion, a suction portion, a cutting portion and a blowing portion. The stage is configured to carry the carrier. The upper fixing portion is disposed above the stage so as to be movable up and down. The suction portion is disposed above the stage so as to be movable up and down, and has a hollow portion to accommodate the upper fixing portion. The cutting portion is disposed on one side of the stage. The blowing portion is disposed on another side of the stage, and is configured to provide a blowing force to a position between the substrate and the carrier.

The present disclosure further provides a substrate separation method configured to be used in a substrate separation system. The substrate separation system is configured to remove a substrate from a carrier. The substrate separation system comprises a stage, an upper fixing portion, a suction portion, a cutting portion and a blowing portion. The upper fixing portion is disposed above the stage so as to be movable up and down. The suction portion is disposed above the stage so as to be movable up and down, and has a hollow portion to accommodate the upper fixing portion. The suction portion having a hollow portion. The cutting portion is disposed on one side of the stage. The blowing portion is disposed on another side of the stage. The substrate separation method comprises: placing the carrier and the substrate located on the carrier on the stage; moving the upper fixing portion downwards to fix the substrate and the carrier to the stage; utilizing the cutting portion to cut an edge of the substrate; moving the suction portion downwards to suck a periphery of an upper surface of the substrate; moving the suction portion upwards to lift the periphery of the upper surface of the substrate; providing a blowing force to a position between the substrate and the carrier by the blowing portion; and moving the upper fixing portion and the suction portion upwards to remove the substrate from the carrier.

The substrate separation system and the method according to the present disclosure can automatically separate the substrate from the carrier by means of blowing, and have the advantages of high efficiency, not being easy to damage the substrate, and low cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the description of this specification, the description of the terms "one embodiment", "some embodiments", "examples", "specific examples", or "some examples", and the like, means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

The terminology used herein is for the purpose of describing particular embodiments only and is not intended to be limiting of the invention. As used herein, the singular forms "a", "said" and "the" are intended to include the plural forms as well, unless the context clearly indicates otherwise. It will be understood that the term "and/or," when used in this specification, specify one or more associated elements, alone or in combination, are provided. It will be further understood that the terms "first," "second," "third," and "fourth," when used in this specification, claim and drawings, are used to distinguish different objects, rather than to describe a specific order. It will be further understood that the terms "comprises" and/or "comprising," when used in this specification, specify the presence of stated features, products, steps, operations, elements, and/or components, but do not preclude the presence or addition of one or more other features, products, steps, operations, elements, components, and/or groups thereof.

Figure 1:
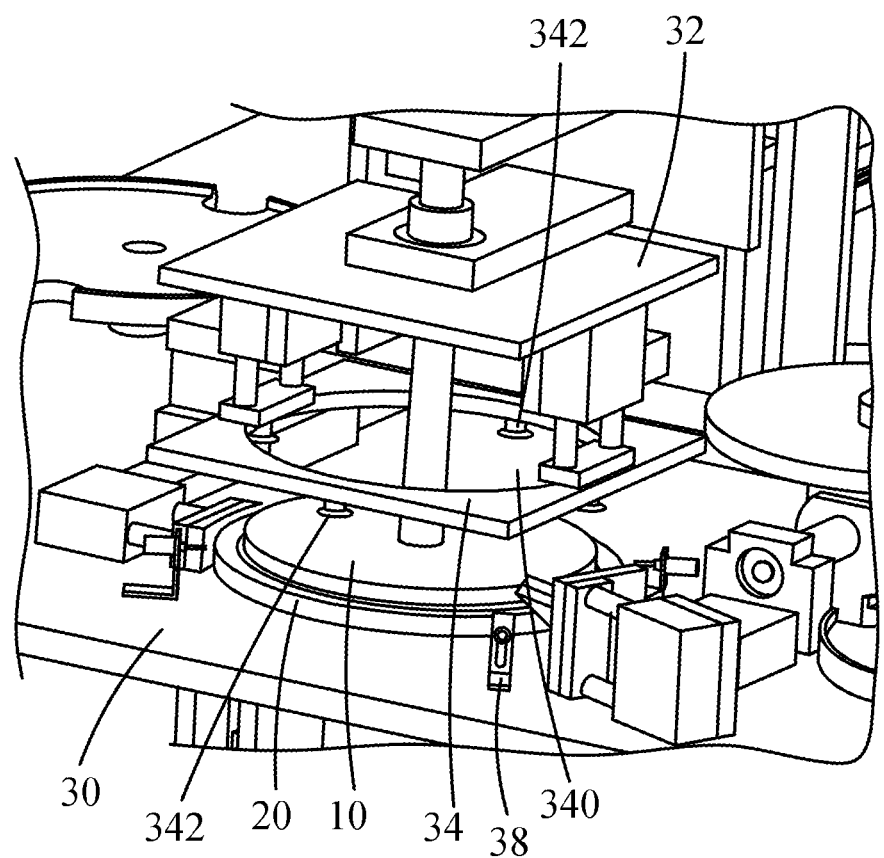
FIG. 1 shows a substrate separation system according to one embodiment of the present disclosure.
Figure 2:
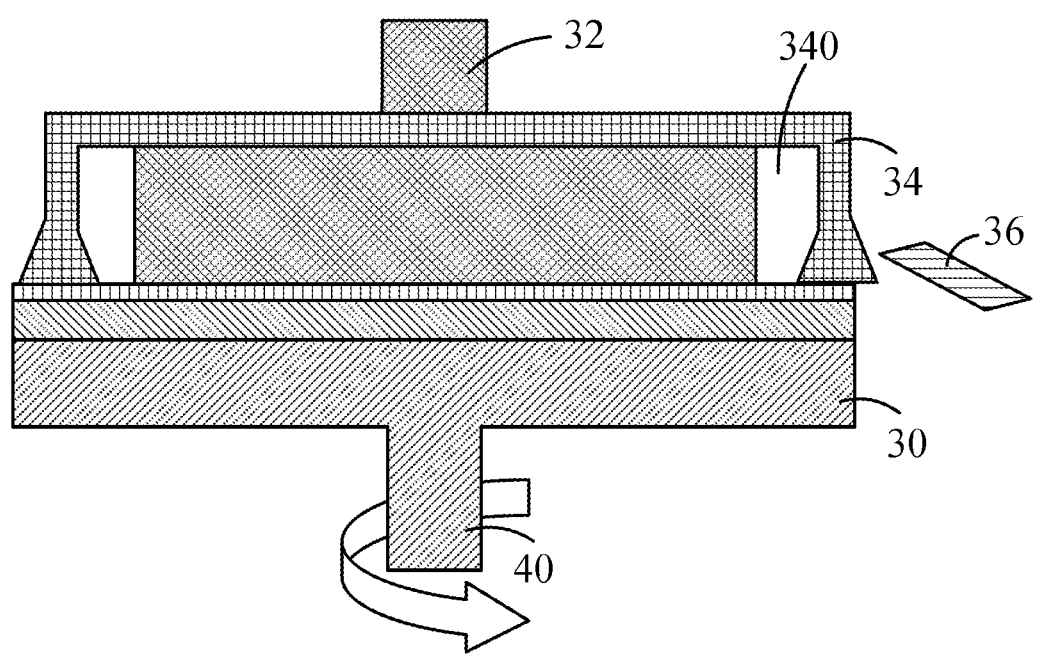
FIG. 2 shows a side view of the substrate separation system.

A description is provided with reference to FIG. 1 and FIG. 2. FIG. 1 shows a substrate separation system according to one embodiment of the present disclosure. FIG. 2 shows a side view of the substrate separation system.

The substrate separation system according to the present disclosure is configured to remove a substrate 10 from a carrier 20.

The substrate 10 comprises a plurality of circuit layers formed thereon. The circuit layers comprise at least one metal layer and at least one dielectric layer that are alternately formed. The at least one metal layer comprises a surface metal layer and at least one inner metal layer.

The substrate separation system comprises a stage 30, an upper fixing portion 32, a suction portion 34, a cutting portion 36, and a blowing portion 38.

The stage 30 is configured to carry the carrier 20. The stage 30 is rotatable.

In a preferred embodiment, the substrate separation system further comprises a lower fixing portion 40. The lower fixing portion 40 is connected to an underside of the stage 30 and is configured to provide a suction force to the carrier 20 so as to enhance the fixing of the carrier 20. The lower fixing portion 40 may be a vacuum suction device, and the lower fixing portion 40 is rotatable.

The upper fixing portion 32 is disposed above the stage 30 so as to be movable up and down. The upper fixing portion 32 is configured to fix the carrier 20 and the substrate 10 on the carrier 20 to the stage 30.

The suction portion 34 is disposed above the stage 30 so as to be movable up and down. The suction portion 34 has a hollow portion 340 to accommodate the upper fixing portion 32. The suction portion 34 comprises a plurality of suction cups 342 for sucking the substrate 10.

The cutting portion 36 is disposed on one side of the stage 30. As mentioned previously, after circuits are formed on the substrate 10, a PI thin film is coated on a surface of the substrate 10 that has the circuits. However, the PI thin film is formed on the surface and a side of the substrate 10. The PI thin film formed on the side of the substrate 10 needs to be removed. The cutting portion 36 is configured to remove the PI thin film formed on the side of the substrate 10. Hence, the cutting portion 36 needs to be disposed on the side of the stage 30 and located at a position where the side of the substrate 10 can be cut.

The blowing portion 38 is disposed on another side of the stage 30, and is configured to provide a blowing force to a position between the substrate 10 and the carrier 20. Hence, the blowing portion 38 needs to be disposed on the another side of the stage 30, and a height of the blowing portion 38 is between the substrate 10 and the carrier 20.

The side on which the cutting portion 36 is disposed and the another side on which the blowing portion 38 is disposed may be the same side or different sides.

A description is provided with reference to FIG. 3A to FIG. 3F. FIG. 3A to FIG. 3F show a substrate separation method according to one embodiment of the present disclosure. The substrate separation method is configured to be used in the substrate separation system shown in FIG. 1 and FIG. 2.

The substrate separation system comprises the stage 30, the upper fixing portion 32, the suction portion 34, the cutting portion 36, the blowing portion 38 and the lower fixing portion 40.

The upper fixing portion 32 is disposed above the stage 30 so as to be movable up and down. The suction portion 34 is disposed above the stage 30 so as to be movable up and down and has a hollow portion 340 to accommodate the upper fixing portion 32. The cutting portion 36 is disposed on one side of the stage 30. The blowing portion 38 is disposed on another side of the stage 30.

Figure 3A:
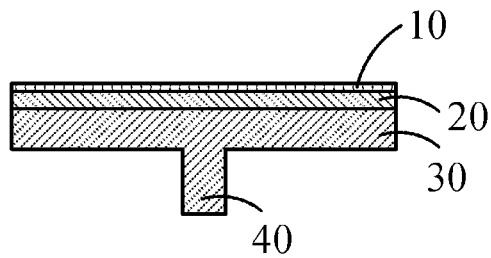
FIG. 3A to FIG. 3F show a substrate separation method according to one embodiment of the present disclosure.

In FIG. 3A, the carrier 20 and the substrate 10 located on the carrier are placed on the stage 30.

Figure 3B:
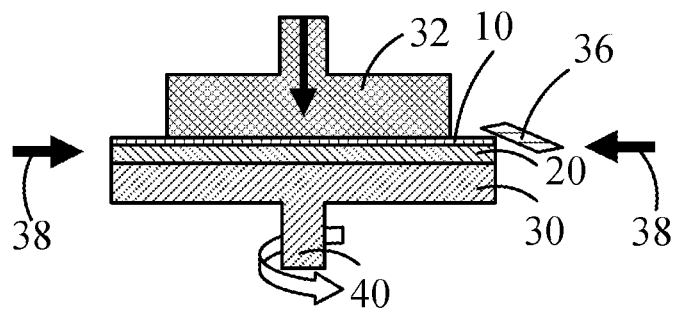

In FIG. 3B, the upper fixing portion 32 is moved downwards to fix the substrate 10 and the carrier 20 to the stage 30. The cutting portion 36 is utilized to cut an edge of the substrate 10 so as to remove a PI thin film formed at the edge of the substrate 10. In one embodiment, the lower fixing portion 40 rotates to drive the stage 30, the carrier 20 and the substrate 10 to rotate. Then, the edge of the substrate 10 is cut by the cutting portion 36 to remove the PI thin film at the edge of the substrate 10.

In a preferred embodiment, the substrate separation system further comprises the lower fixing portion 40 connected to an underside of the stage 30. After the step of moving the upper fixing portion 32 downwards to fix the substrate 10 and the carrier 20 to the stage 30, the substrate separation method further comprises: The lower fixing portion 40 provides an suction force to the carrier 20 so as to enhance the fixing of the carrier 20.

Figure 3C:
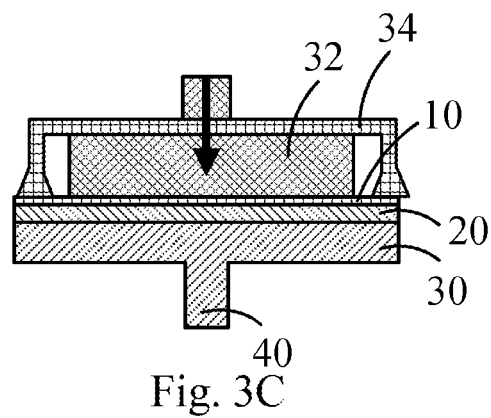

In FIG. 3C, the suction portion 34 is moved downwards to suck a periphery of an upper surface of the substrate 10.

Figure 3D:
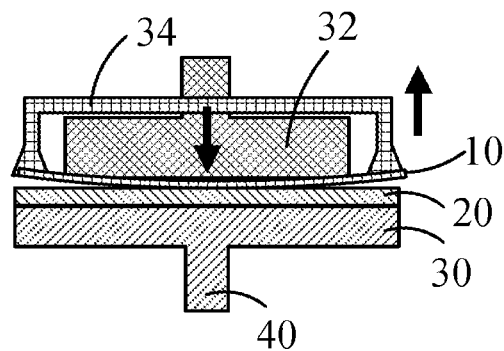

In FIG. 3D, the suction portion 34 is moved upwards to lift the periphery of the upper surface of the substrate 10.

Since the suction portion 34 sucks only the periphery of the upper surface of the substrate 10, only the periphery of the upper surface of the substrate 10 is lifted, and an intermediate portion of the upper surface of the substrate 10 is still fixed by the upper fixing portion 32.

In a preferred embodiment, a height at which the substrate 10 is lifted up (that is, a distance between the substrate 10 and the carrier 20) is from 1 centimeter (cm) to 1.5 cm.

Figure 3E:
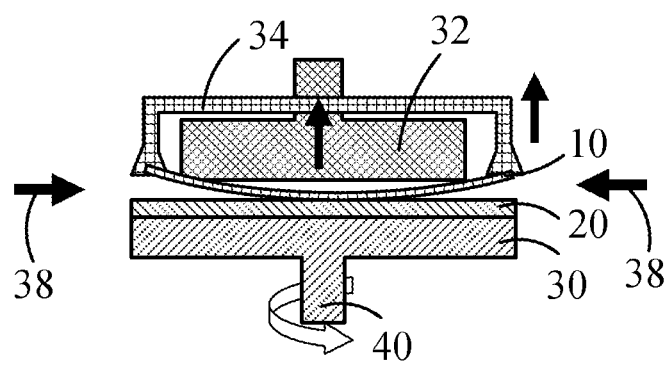

In FIG. 3E, the blowing portion 38 provides a blowing force to a position between the substrate 10 and the carrier 20 so as to increase the distance between the substrate 10 and the carrier 20.

Figure 3F:
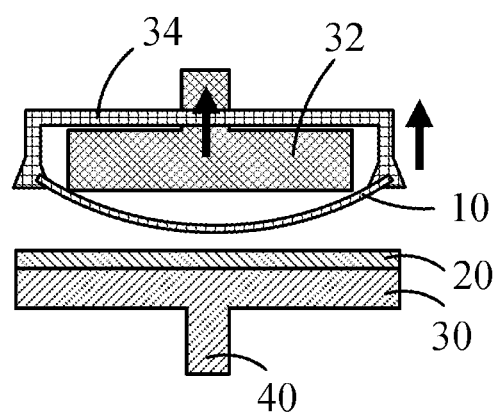

In FIG. 3F, the upper fixing portion 32 and the suction portion 34 are moved upwards to remove the substrate 10 from the carrier 20.

The substrate separation system and the method according to the present disclosure can automatically separate the substrate from the carrier by means of blowing, and have the advantages of high efficiency, not being easy to damage the substrate, and low cost.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A substrate separation system configured to remove a substrate from a carrier comprising:
    a stage configured to carry the carrier;
    an upper fixing portion disposed above the stage so as to be movable up and down;
    a suction portion disposed above the stage so as to be movable up and down, the suction portion having a hollow portion to accommodate the upper fixing portion;
    a cutting portion disposed on one side of the stage; and
    a blowing portion disposed on another side of the stage, and being configured to provide a blowing force to a position between the substrate and the carrier.

2. The substrate separation system as claimed in claim 1, further comprising a lower fixing portion, wherein the lower fixing portion is connected to an underside of the stage, and is configured to provide a suction force to the carrier.

3. The substrate separation system as claimed in claim 2, wherein the lower fixing portion is a vacuum suction device.

4. The substrate separation system as claimed in claim 1, wherein the upper fixing portion is configured to fix the carrier and the substrate on the carrier to the stage.

5. The substrate separation system as claimed in claim 1, wherein the suction portion comprises a plurality of suction cups for sucking the substrate.

6. A substrate separation method configured to be used in a substrate separation system, the substrate separation system being configured to remove a substrate from a carrier, the substrate separation system comprising a stage, an upper fixing portion, a suction portion, a cutting portion and a blowing portion, the upper fixing portion being disposed above the stage so as to be movable up and down, the suction portion being disposed above the stage so as to be movable up and down, and having a hollow portion to accommodate the upper fixing portion, the suction portion having a hollow portion, the cutting portion being disposed on one side of the stage, the blowing portion being disposed on another side of the stage, the substrate separation method comprising:
    placing the carrier and the substrate located on the carrier on the stage;
    moving the upper fixing portion downwards to fix the substrate and the carrier to the stage;
    utilizing the cutting portion to cut an edge of the substrate;
    moving the suction portion downwards to suck a periphery of an upper surface of the substrate;
    moving the suction portion upwards to lift the periphery of the upper surface of the substrate;
    providing a blowing force to a position between the substrate and the carrier by the blowing portion; and
    moving the upper fixing portion and the suction portion upwards to remove the substrate from the carrier.

7. The substrate separation method as claimed in claim 6, wherein the substrate separation system further comprises a lower fixing portion connected to an underside of the stage, the substrate separation method further comprises the following step after the step of moving the upper fixing portion downwards to fix the substrate and the carrier to the stage:
    providing a suction force to the carrier by the lower fixing portion.

8. The substrate separation method as claimed in claim 6, wherein an intermediate portion of the upper surface of the substrate is fixed by the upper fixing portion in the step of moving the suction portion upwards to lift the periphery of the upper surface of the substrate.

9. The substrate separation method as claimed in claim 6, wherein a height at which the substrate is lifted up is from 1 cm to 1.5 cm in the step of moving the suction portion upwards to lift the periphery of the upper surface of the substrate.

10. The substrate separation method as claimed in claim 6, wherein the suction portion comprises a plurality of suction cups for sucking the substrate.

* * * * *